(12) United States Patent
Nakanishi et al.

(10) Patent No.: US 9,801,311 B2
(45) Date of Patent: Oct. 24, 2017

(54) COOLING DEVICE AND ELECTRONIC DEVICE SYSTEM

(71) Applicant: FUJITSU LIMITED, Kawasaki-shi, Kanagawa (JP)

(72) Inventors: Teru Nakanishi, Isehara (JP); Nobuyuki Hayashi, Yokohama (JP); Takahiro Kimura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/094,460

(22) Filed: Apr. 8, 2016

(65) Prior Publication Data

US 2016/0381838 A1    Dec. 29, 2016

(30) Foreign Application Priority Data

Jun. 24, 2015 (JP) ................. 2015-127048

(51) Int. Cl.
*H05K 7/20* (2006.01)
*F28D 15/02* (2006.01)
*F28D 15/06* (2006.01)

(52) U.S. Cl.
CPC ..... *H05K 7/20809* (2013.01); *F28D 15/0266* (2013.01); *F28D 15/06* (2013.01); *F28F 2250/08* (2013.01)

(58) Field of Classification Search
CPC .................................. H05K 7/20809
USPC ............................ 361/679.53, 699, 700, 701
See application file for complete search history.

(56) References Cited

U.S. PATENT DOCUMENTS 7,061,763 B2 * 6/2006 Tsoi ........................ F25B 1/06
                                                        165/104.33
2007/0273024 A1    11/2007 Madsen et al.
2009/0078791 A1 *  3/2009 Guillon ............... C23C 16/4486
                                                        239/398

FOREIGN PATENT DOCUMENTS

JP    2007-513506    5/2007
JP    2014-183107    9/2014

* cited by examiner

*Primary Examiner* — Tuan T Dinh
*Assistant Examiner* — Mukund G Patel
(74) *Attorney, Agent, or Firm* — Fujitsu Patent Center (57) ABSTRACT

A cooling system, includes: an evaporator configured to take heat from a heat source by latent heat of evaporation of liquid; an aspirator configured to suck vapor generated in the evaporator and decompress an inside of the evaporator; a liquid supplying unit configured to supply liquid to the aspirator and the evaporator; and a gas mixing unit configured to mix gas into the liquid to be supplied from the liquid supplying unit to the evaporator.

11 Claims, 9 Drawing Sheets

COOLING DEVICE AND ELECTRONIC DEVICE SYSTEM

CROSS-REFERENCE TO RELATED APPLICATION

This application is based upon and claims the benefit of priority of the prior Japanese Patent Application No. 2015-127048, filed on Jun. 24, 2015, the entire contents of which are incorporated herein by reference.

FIELD

The embodiment disclosed herein is related to a cooling device and an electronic device system.

BACKGROUND

Since enhancement in performance of information devices such as a server is accelerated, also the heat generation amount of a central processing unit (CPU), a memory, a power supply module and so forth used in an information device increases. The heat generation amount of a CPU is especially great, and such parts as demonstrate power consumption of several hundreds W or more have been developed.

A related art is disclosed in Japanese Laid-open Patent Publication No. 2014-183107.

SUMMARY

According to an aspect of the embodiment, a cooling device, includes: an evaporator configured to take heat from a heat source by latent heat of evaporation of liquid; an aspirator configured to suck vapor generated in the evaporator and decompress an inside of the evaporator; a liquid supplying unit configured to supply liquid to the aspirator and the evaporator; and a gas mixing unit configured to mix gas into the liquid to be supplied from the liquid supplying unit to the evaporator.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

A cooling water supplying facility (coolant distribution unit (CDU)) is prepared in a building in which a high-end product represented by a server or a supercomputer is installed, and parts that generate heat are cooled by water (heat exchange by sensible heat). For example, in a simple water-cooling system, a large heat sink may be prepared in order to cope with increase of the heat generation amount in future, and this may increase the size of the apparatus.

For example, a cooling method that utilizes latent heat of evaporation of liquid in an evaporator may be provided.

For example, in a cooling method that utilizes latent heat of evaporation, as the heat generation amount of the heat source (a CPU or the like) decreases, the liquid in the evaporator becomes less liable to boil, and therefore, the cooling performance may not be demonstrated sufficiently.

Figure 1:
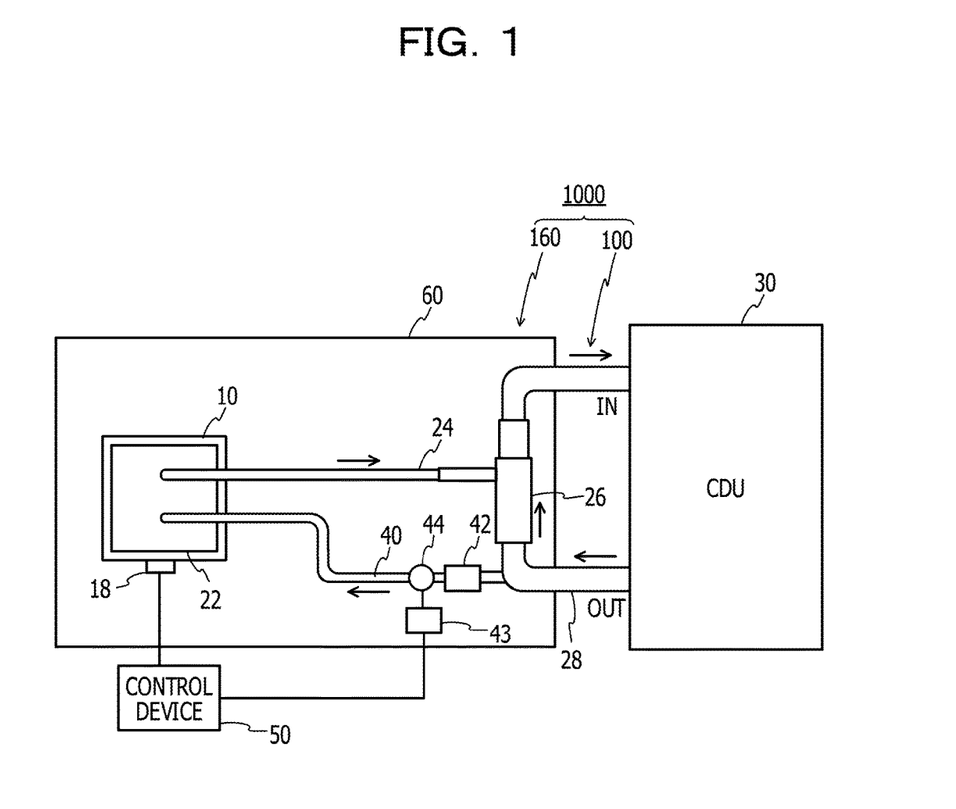
FIG. 1 depicts an example of an electronic device system.
Figure 8A:
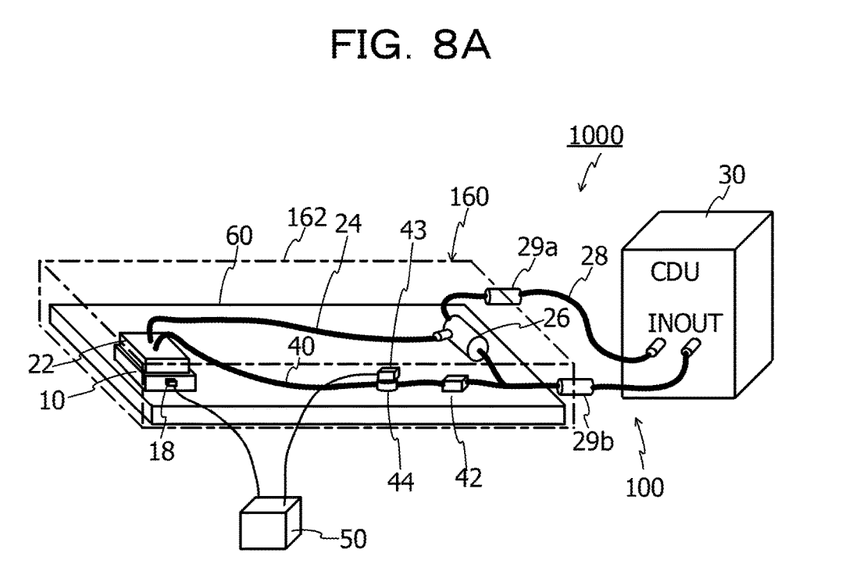
FIGS. 8A and 8B depict examples of a perspective view of an electronic device system.
Figure 8B:
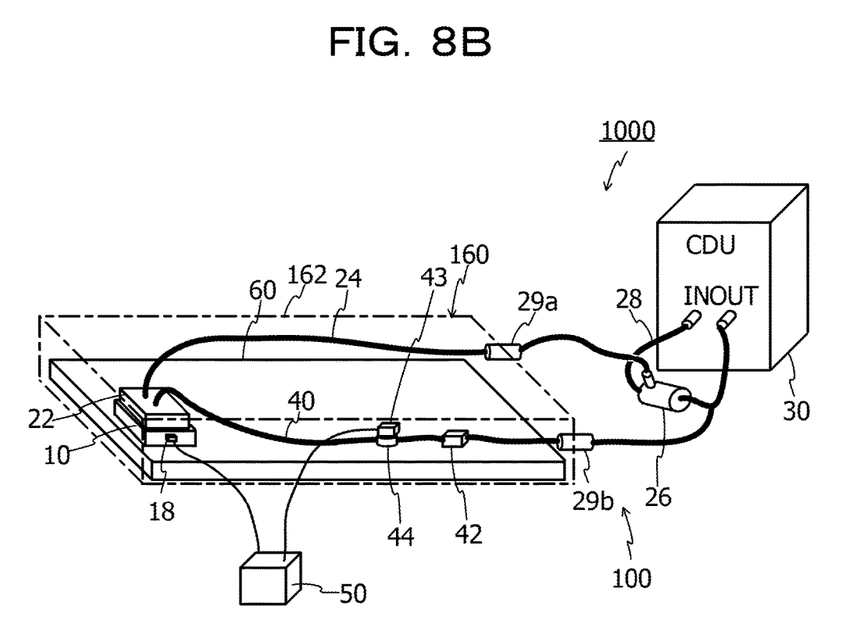

FIG. 1 depicts an example of an electronic device system. As depicted in FIG. 1, an electronic device system 1000 includes an electronic device 160 and a cooling system 100. The electronic device 160 may be such a device as a server and includes, for example, a system board 60 and a CPU 10 mounted on the system board 60. FIGS. 8A and 8B depict examples of a perspective view of an electronic device system. The electronic device systems depicted in FIGS. 8A and 8B may be the electronic device system 1000 depicted in FIG. 1. The electronic device 160 may be included, for example, in a rack 162 as depicted in FIG. 8A.

The cooling system 100 is an apparatus for cooling a heat source mounted on the electronic device 160. The heat source to be cooled by the cooling system 100 may be the CPU 10. As depicted in FIG. 1, the cooling system 100 includes an evaporator 22, an aspirator 26, a CDU 30 as a liquid supplying unit, a water amount regulator 42, a leak valve 44, and a control device 50. The cooling system 100 may cool a heat source (a memory, a hard disk drive (HDD), a power supply module or the like) other than the CPU 10.

A cooling medium, for example, water, is accommodated in an internal space of the evaporator 22. Water may be used as a cooling medium from standpoints of performance, safety, and low environmental load. The CPU 10 is cooled by latent heat by phase-change (change from liquid to gas) of the water in the evaporator 22 when the water is heated by the CPU 10, from which heat is generated, to cause nucleate boiling and change into water vapor. One end of a steam pipe 24 and one end of a liquid pipe 40 are coupled to the evaporator 22. Since cooling by latent heat is higher in efficiency than air cooling or liquid cooling, it may cope with a great amount of heat generation.

Figure 2:
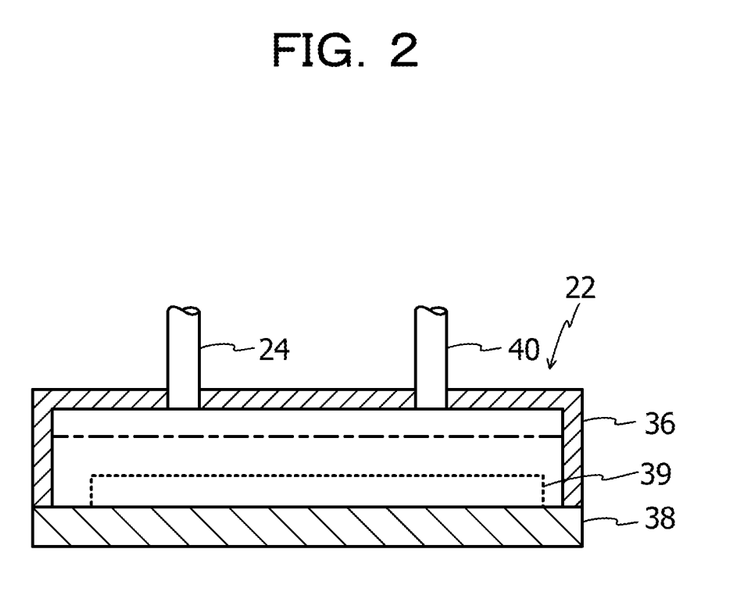
FIG. 2 depicts an example of a vertical sectional view of an evaporator.

FIG. 2 depicts an example of a vertical sectional view of an evaporator. In FIG. 2, a vertical sectional view of the evaporator 22 is depicted. The evaporator 22 includes a copper plate 38 of, for example, 3 mm thick, 40 mm long, and 40 mm wide, a boiling promotion structure 39 provided in an area of 25 mm long and 25 mm wide of a central portion of the copper plate 38, and an evaporator cover 36 that covers the top of the copper plate 38. As the boiling promotion structure 39, for example, a structure wherein posts of 2 mm high, 1 mm long, and 1 mm wide are arrayed in a pitch of 1.5 mm or a like structure may be adopted.

One end of the steam pipe 24 and one end of the liquid pipe 40 are attached to the evaporator cover 36. As a coupling method between the copper plate 38 and the evaporator cover 36, a suitable method may be selected in accordance with a usage environment or the like of the cooling system 100 from among brazing, welding, adhesion, a mechanical coupling method using an O-ring and so forth.

The evaporator 22 and the CPU 10 may be in direct contact with each other, or a given material may be interposed between the evaporator 22 and the CPU 10. In the latter case, grease or a sheet (heat conductor) having a high thermal conductivity may be sandwiched between the evaporator 22 and the CPU 10 while pressure is applied between the evaporator 22 and the CPU 10 using a screw or a spring so that the evaporator 22 and the CPU 10 closely contact with each other.

Figure 3:
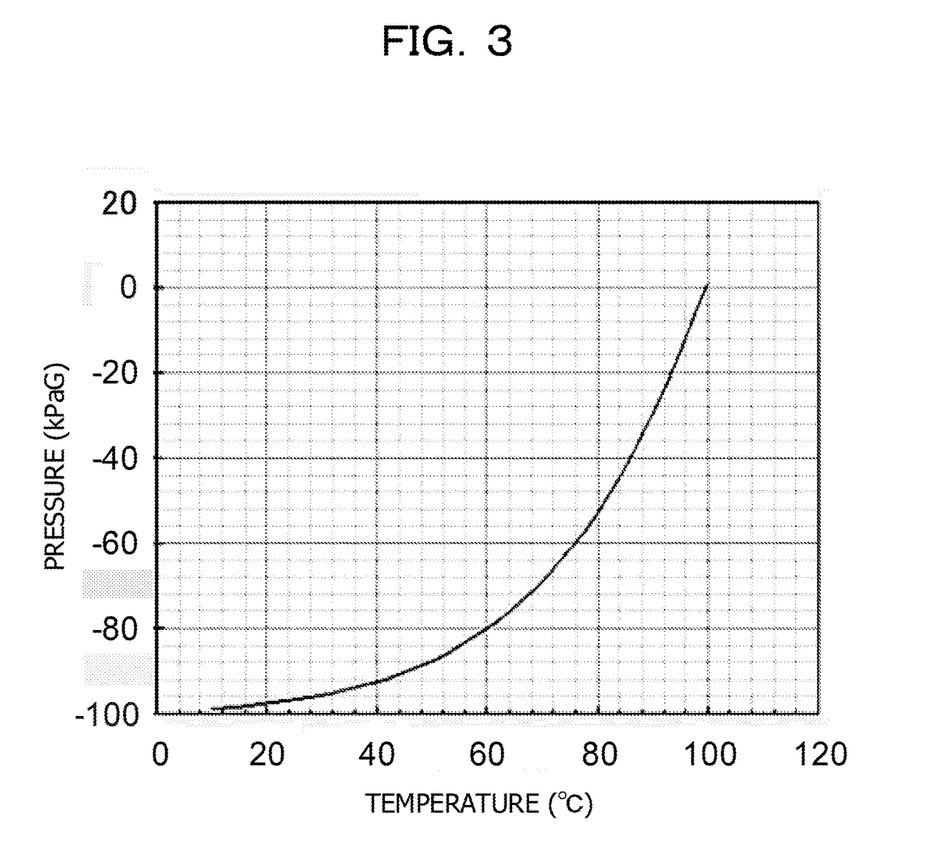
FIG. 3 depicts an example of a vapor pressure curve illustrating a relationship between temperature of water and vapor pressure.

FIG. 3 depicts an example of a vapor pressure curve indicating a relationship between temperature of water and vapor pressure. In FIG. 3, a vapor pressure curve is depicted which indicates a relationship between the temperature of water and the vapor pressure (gauge pressure with reference to the atmospheric pressure). In FIG. 3, the axis of abscissa indicates the temperature of water and the axis of ordinate indicates the gauge pressure, and a relationship between the boiling point of water and the pressure is indicated. In FIG. 3, as the pressure drops, also the boiling point of water drops. For example, while the boiling point is 100° C. when the pressure is 0 kPaG, the boiling point at −90 kPaG is approximately 40° C. to 50° C. Accordingly, the inside of the evaporator 22 may be decompressed by the aspirator 26 such that the boiling point of the water in the evaporator 22 may be lowered.

Referring back to FIG. 1, the aspirator 26 is provided at part of a liquid circulation path 28 and includes a pipe shaped such that it is narrowed at part thereof. In the aspirator 26, if water is supplied into the inside of the pipe as indicated by an arrow mark in FIG. 1, the flow velocity of the water increases in the proximity of the narrowed portion, and therefore, the pressure of the water decreases by a Venturi effect. By the decrease of the pressure of the water, vapor in the inside of the steam pipe 24 coupled to the aspirator 26 flows into the water flow, and as a result, the inside of the steam pipe 24 and the evaporator 22 is decompressed. Therefore, the water vapor generated in the evaporator 22 flows into the aspirator 26 via the steam pipe 24.

The CDU 30 includes a condenser, a gas-liquid separator, a pump and so forth. The condenser performs heat exchange between the water flowing in the liquid circulation path 28 and the atmospheric air and has a function of condensing the water vapor into water. The gas-liquid separator is an apparatus that is used when the inside of the cooling system 100 is decompressed at the outset of an operation, and separates gas mixed in the water flowing in the liquid circulation path 28 and discharges the gas to the outside (atmosphere). The pump is an apparatus for creating a flow of water in the liquid circulation path 28. For example, from the CDU 30, water is supplied to the aspirator 26 at a flow rate of approximately 5 L/minute.

The water amount regulator 42 is a valve provided on the liquid pipe 40 branching from the liquid circulation path 28 and adjusts the amount of water to flow along the liquid pipe 40. When the cooling system 100 is installed into the electronic device system 1000, after the water amount regulator 42 is adjusted in accordance with the type and so forth of the electronic device 160, the amount of water to flow along the liquid pipe 40 is maintained fixed. For example, the water amount regulator 42 supplies part (flow rate of approximately 200 mL/minute) of the water supplied at a flow rate of approximately 5 L/minute from the CDU 30 to the liquid pipe 40. At this time, the pressure in the evaporator 22 may be approximately −90 kPaG by gauge pressure.

The leak valve 44 is provided at the downstream side of the water amount regulator 42 on the liquid pipe 40. The leak valve 44 is a valve for mixing the external air into water flowing in the liquid pipe 40 when the heat generation is low. If the leak valve 44 is opened, since the inside of the evaporator 22 is in a decompressed state, naturally the external air flows into the liquid pipe 40. Since the external air having advanced into the liquid pipe 40 is mixed into the water flowing in the liquid pipe 40, the water in a state in which air bubbles are mixed is supplied to the evaporator 22. In the evaporator 22, the water is stirred by the air bubbles, and the fluidity is increased while the amount of water (coolant) is small. Therefore, the heat exchange efficiency increases, and the cooling performance when the heat generation is low may be improved. The external air mixed in the evaporator 22 flows from the evaporator 22 into the steam pipe 24 and is sucked into the aspirator 26 and then enters the CDU 30. The external air is separated from the water by the gas-liquid separator in the CDU 30 and is released to the outside (atmosphere). The opening of the leak valve 44 is adjusted by a stepping motor 43 under the control of the control device 50.

The control device 50 acquires a detection result of a detector 18 as a detection unit that detects the power consumption of the CPU 10. The control device 50 controls the stepping motor 43 based on the detection result to adjust the opening of the leak valve 44.

Figure 4:
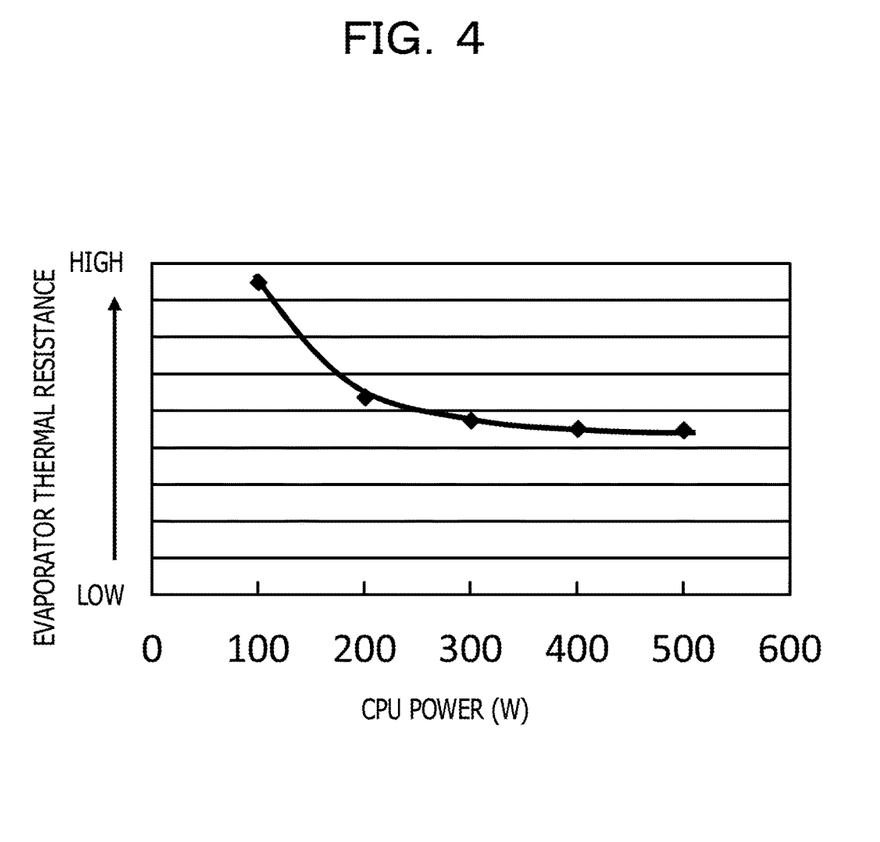
FIG. 4 depicts an example of a cooling performance.

FIG. 4 depicts an example of a cooling performance. In FIG. 4, an example of a variation of the boiling cooling performance with respect to the power consumption of the CPU 10 when external air is not mixed into water is represented in a graph. In FIG. 4, the axis of abscissa indicates the power consumption of the CPU 10, and the axis of ordinate indicates the evaporator thermal resistance. As the evaporator thermal resistance decreases in value, the boiling cooling performance increases. Since boiling occurs actively in the evaporator 22 in a high heat generation state in which the heat generation amount of the CPU 10 is several hundreds W or more as depicted in FIG. 4, the cooling performance is high. However, in a heat generation state of several tens W to approximately 100 W, the boiling is weak and the cooling performance is low.

Figure 5:
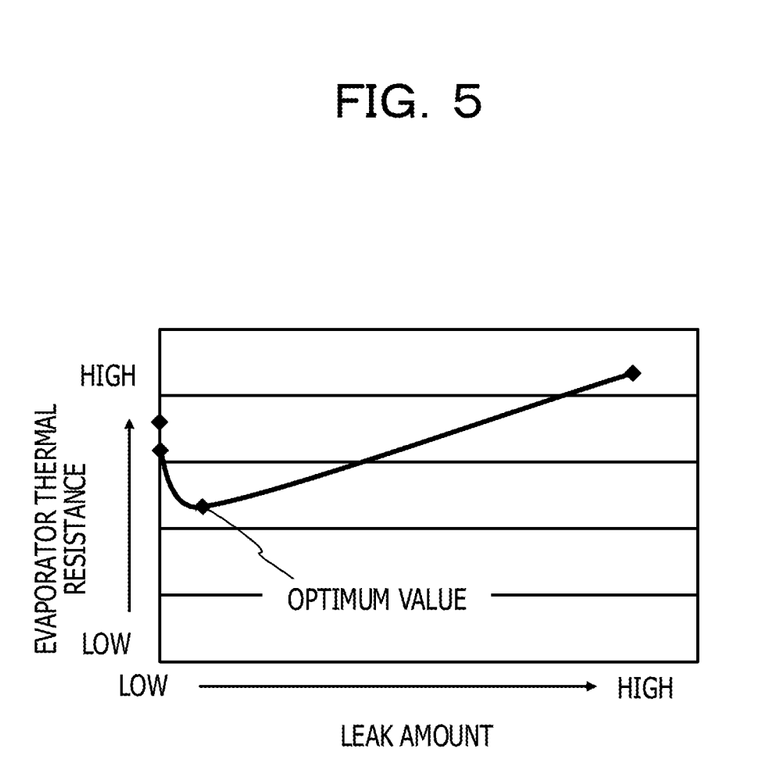
FIG. 5 depicts an example of a relationship between leak amount and evaporator thermal resistance.

FIG. 5 depicts an example of a relationship between leak amount and evaporator thermal resistance. In a range from several tens W to approximately 100 W, such a relationship between the leak amount and the evaporator thermal resistance as depicted in FIG. 5 is derived for each power consumption, and an optimum value of the leak amount with respect to each power consumption, for example, a leak amount with which the evaporator thermal resistance demonstrates its minimum value, is determined. A target leak amount table that associates power consumption and corresponding optimum values of the leak amount (also referred to as target leak amounts) with each other may be created in advance. The control device 50 controls the stepping motor 43 based on the target leak amount table to cause the leak amount coincide with a target leak amount corresponding to the power consumption of the CPU 10 acquired from the detector 18 thereby to adjust the opening of the leak valve 44.

In the cooling system 100, the CDU 30 and the control device 50 are provided outside the rack 162 while the aspirator 26, the water amount regulator 42, the leak valve 44, the stepping motor 43, the evaporator 22 and so forth are provided inside the rack 162 as depicted in FIG. 8A. Part of the liquid circulation path 28 extends into the rack 162 through connectors 29a and 29b provided on the rack 162.

Figure 6:
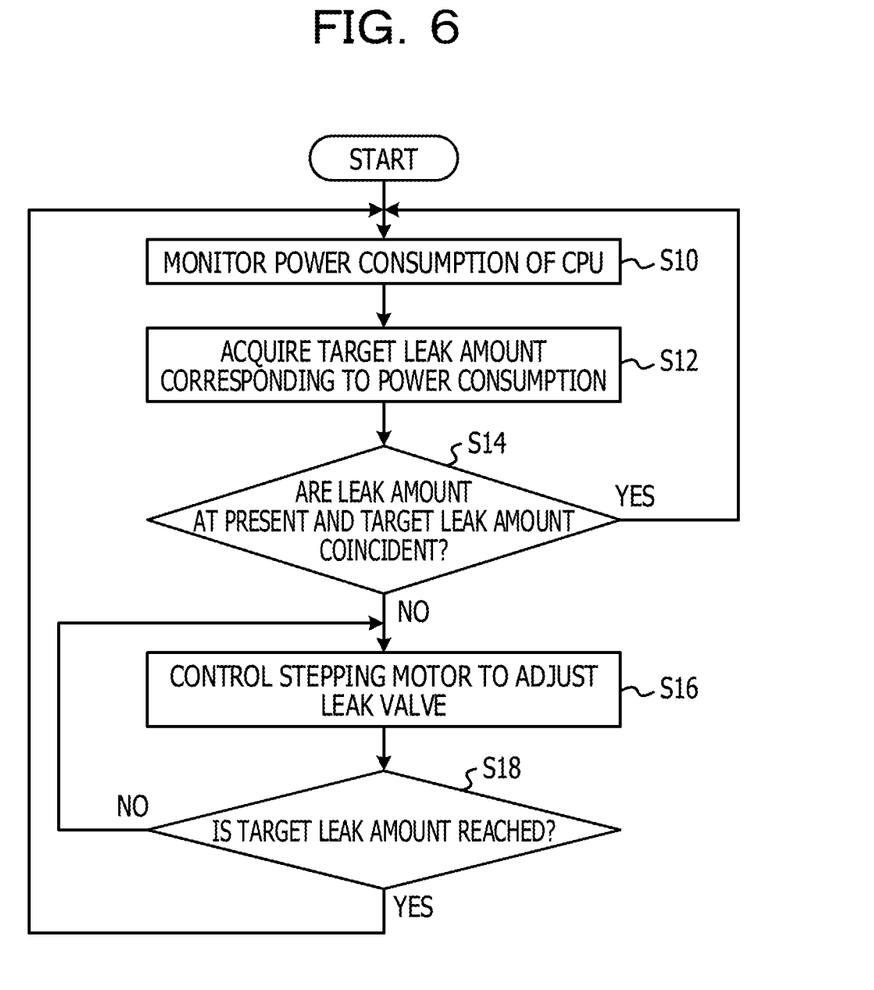
FIG. 6 depicts an example of a process of a control device.

FIG. 6 depicts an example of a process of a control device. The control device 50 depicted in FIG. 1 may execute the process depicted in FIG. 6. For example, the process of FIG. 6 may be executed while the electronic device 160 is operative.

Referring to FIG. 6, the control device 50 monitors (acquires) the power consumption of the CPU 10 using the detector 18 at operation S10.

At operation S12, the control device 50 acquires a target leak amount corresponding to the acquired power consumption from the target leak amount table. At operation S14, the control device 50 decides whether or not the leak amount at present coincides with the target leak amount. For example, the control device 50 decides whether or not the opening of the leak valve 44 at present coincides with an opening corresponding to the target leak amount. If the decision in operation S14 is in the affirmative, since there is no necessity to adjust the leak valve 44 at the present point of time, the processing returns to operation S10, and operations S10 to S14 are repeated. If the decision in operation S14 is in the negative, the processing advances to operation S16.

After the processing advances to operation S16, the control device 50 controls the stepping motor 43 to adjust the leak valve 44. In this case, the control device 50 adjusts the leak valve 44 by a fixed amount determined in advance in a direction in which the leak valve 44 is opened or closed. At operation S18, the control device 50 decides whether or not the leak amount at present reaches the target leak amount. If the decision here is in the negative, the processing returns to operation S16, and operations S16 and S18 are repeated until the leak amount at present reaches the target leak amount.

If the decision in operation S18 is in the affirmative, the processing returns to operation S10 to repeat operations S10 to S18.

Figure 7:
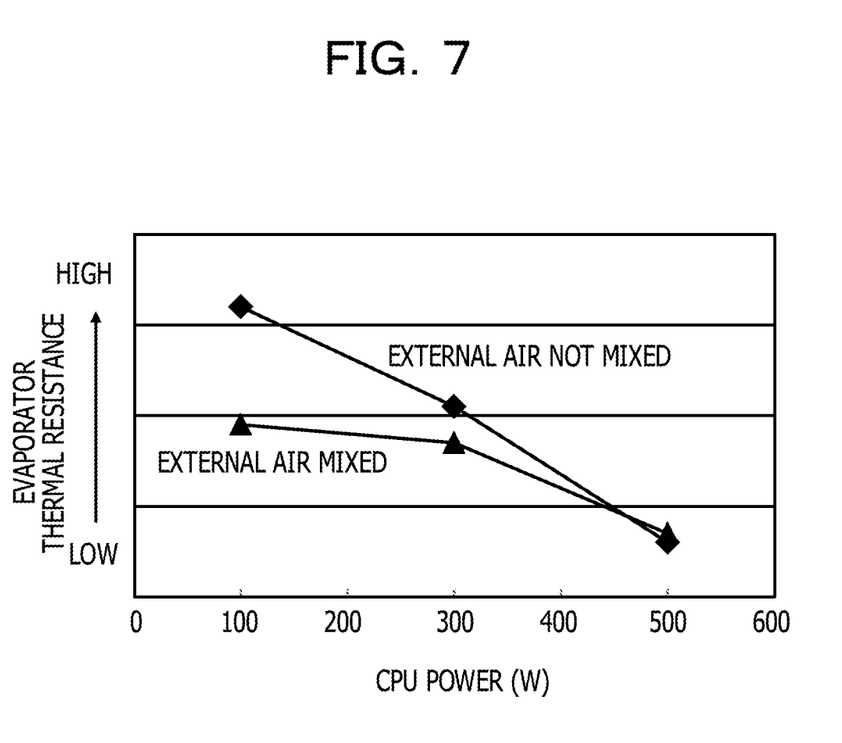
FIG. 7 depicts an example of a relationship between power consumption and evaporator thermal resistance.
Figure 9:
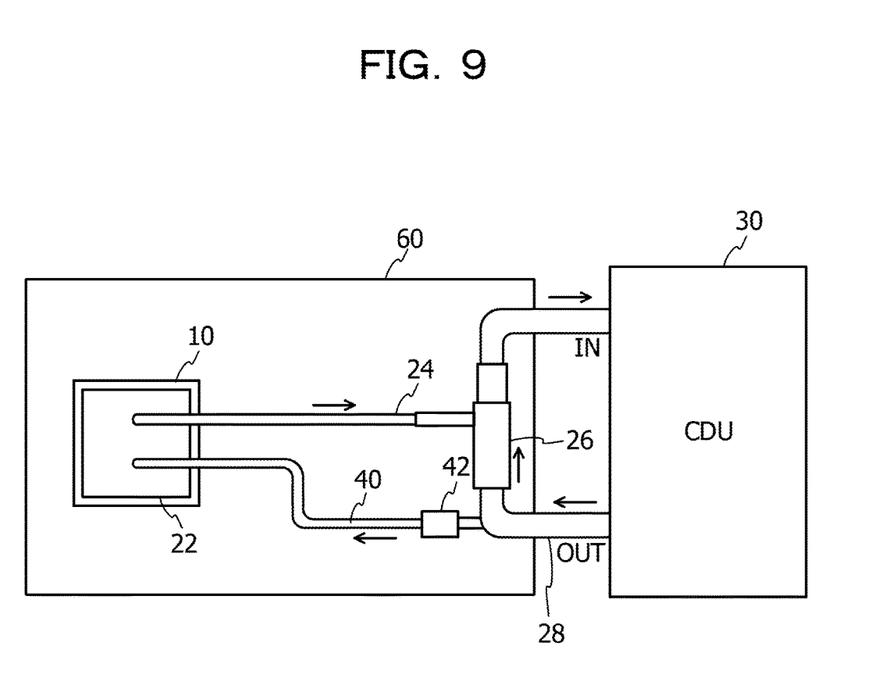
FIG. 9 depicts an example of an electronic device system that includes a cooling device in which no leak valve is provided.

When the power consumption of the CPU 10 is low (several tens W to approximately one hundred and several tens W), the performance of the evaporator 22 may be improved by mixing external air into water to be supplied to the evaporator 22. FIG. 7 depicts an example of a relationship between power consumption and evaporator thermal resistance. FIG. 9 depicts an example of an electronic device system that includes a cooling system in which no leak valve is provided. In FIG. 7, a difference in evaporator thermal resistance between a case in which external air is mixed into water to be supplied to the evaporator 22 using the cooling system 100 and another case in which such a cooling system that does not include a leak valve as depicted in FIG. 9 is used (in a case in which no external air is mixed into water). In FIG. 7, the cooling performance is improved significantly by mixing external air into water when the power consumption is low (when the power consumption has a value around 100 W).

A gas mixing unit may be provided which includes the leak valve 44, the stepping motor 43, and the control device 50 and mixes external air into water to be supplied from the CDU 30 to the evaporator 22.

The cooling system 100 includes an evaporator 22 that takes heat from a heat source (CPU 10) by latent heat of evaporation of water, an aspirator 26 that uses flow of water and sucks water vapor generated in the evaporator 22 to decompress the inside of the evaporator 22, a CDU 30 that supplies water into the aspirator 26 and the evaporator 22, and a leak valve 44 that mixes external air into the water to be supplied from the CDU 30 to the evaporator 22. By mixing external air into the water to be supplied to the evaporator 22, the water in the evaporator 22 is stirred, and the fluidity may be increased even with a small amount of water and the heat exchange efficiency may be improved, resulting in improvement in cooling performance of the evaporator 22.

The cooling system 100 includes a control device 50 that adjusts the opening of the leak valve 44 through a stepping motor 43. Therefore, the opening of the leak valve 44 is automatically adjusted to an appropriate opening.

A detector 18 that detects a state of the CPU 10, for example, the power consumption of the CPU 10, is provided. The control device 50 adjusts the opening of the leak valve 44 based on a result of detection by the detector 18. Therefore, since the leak valve 44 is adjusted to an appropriate opening based on the state of the CPU 10, the cooling performance of the evaporator 22 may be maintained high irrespective of the state of the CPU 10.

Since the amount of external air to be mixed into water to be supplied to the evaporator 22 increases as the power consumption of the CPU 10 decreases, the cooling performance of the evaporator 22 when the power consumption is low may be improved appropriately.

Since the CDU 30 includes a gas-liquid separator that separates external air mixed in water and releases the separated external air to the atmosphere, such a situation that water in which external air is mixed continues to circulate in the cooling system 100 may decrease. By the opening adjustment of the leak valve 44, the mixture amount of external air into water to be supplied to the evaporator 22 may be controlled to an appropriate value.

In the electronic device system 1000, since the CPU 10 of the electronic device 160 is cooled by the cooling system 100, a thermal influence of heat generation of the CPU 10 on the CPU 10 itself and/or on a device or devices around the CPU 10 may be reduced.

The detector 18 may detect the power consumption of the CPU 10. For example, the detector 18 may detect the temperature of the CPU 10. In this case, the control device 50 may control the stepping motor 43 based on a table indicative of the relationship between the temperature of the CPU 10 and the target leak amount to adjust the opening of the leak valve 44.

The relationship between the cooling system 100 and the rack 162 may be such as depicted in FIG. 8A, for example, such a relationship that the aspirator 26 exists in the rack 162. Alternatively, for example, the aspirator 26 may exist outside the rack 162 as depicted in FIG. 8B. For example, at least one of the leak valve 44, the stepping motor 43, and the water amount regulator 42 depicted in FIG. 8B may be set to the outside of the rack 162.

The state of the CPU 10 may be detected directly by the detector 18 provided in the CPU 10. Alternatively, the state of the CPU 10 may be detected indirectly, for example, by detecting the temperature of the steam pipe 24.

The opening of the leak valve 44 may be controlled by the control device 50. Alternatively, for example, the opening of the leak valve 44 may be adjusted by human based on a result of detection of the detector 18.

As the coolant to be supplied to the evaporator 22, water may be used, or some other coolant such as, for example, ethyl alcohol, chlorofluorocarbon (CFC), and CFC substitute may be used.

Where a server includes a plurality of CPUs, the cooling system 100 may cool the CPUs. For example, the cooling system 100 may include a number of evaporators 22 or aspirators 26 corresponding to the number of CPUs and may include a number of other elements, which can be used in common such as CDUs 30, smaller than the number of the CPUs and may include, for example, only one element.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A cooling device, comprising:
an evaporator configured to take heat from a heat source by latent heat of evaporation of liquid;
an aspirator configured to suck vapor generated in the evaporator and decompress an inside of the evaporator;
a liquid supplier configured to supply liquid to the aspirator and the evaporator;
a liquid pipe coupled to a surface of the evaporator and configured to supply the liquid from the liquid supplier to the evaporator; and
a steam pipe coupled to the surface of the evaporator and configured to supply steam from the evaporator to the aspirator; and
a gas mixer configured to mix gas into the liquid to be supplied from the liquid supplier to the evaporator,
wherein the gas mixer includes:
a regulating valve configured to adjust an amount of the gas to be mixed into the liquid; and
a controller configured to control an opening of the regulating valve, wherein the controller increases the opening of the regulating valve to mix more gas to the liquid as power consumption of the heat source decreases or as temperature of the heat source decreases.

2. The cooling device according to claim 1, further comprising:
a detector configured to detect the power consumption of the heat source or the temperature of the heat source.

3. The cooling device according to claim 1, wherein a cross-sectional area at an output of the aspirator is smaller than a cross-sectional area at an input of the aspirator, and the steam pipe is coupled to the aspirator at an area adjacent to the output.

4. The cooling device according to claim 1, further comprising:
a table having leak amounts associated with corresponding power consumption of the heat source,
wherein the power consumption of the heat source is detected and a leak valve included in the gas mixer is adjusted based on the leak amount obtained from the table and corresponding to the detected power consumption level.

5. The cooling device according to claim 1, wherein the liquid supplier recovers the liquid in which the gas is mixed, separates the gas from the liquid, and supplies the liquid again to the aspirator and the evaporator.

6. An electronic device system, comprising:
a cooling device; and
an electronic device cooled by the cooling system,
wherein the cooling device includes:
an evaporator configured to take heat from the electronic device by latent heat of evaporation of liquid;
an aspirator configured to suck vapor generated in the evaporator and decompress an inside of the evaporator;
a liquid supplier configured to supply liquid to the aspirator and the evaporator;
a liquid pipe coupled to a surface of the evaporator and configured to supply the liquid from the liquid supplier to the evaporator; and
a steam pipe coupled to the surface of the evaporator and configured to supply steam from the evaporator to the aspirator; and
a gas mixer configured to mix gas into the liquid to be supplied from the liquid supplier to the evaporator,
wherein the gas mixer includes:
a regulating valve configured to adjust an amount of the gas to be mixed into the liquid; and
a controller configured to control an opening of the regulating valve,
wherein the controller increases the opening of the regulating valve to mix more gas to the liquid as power consumption of the heat source decreases or as temperature of the heat source decreases.

7. The electronic device system according to claim 6, wherein the aspirator is provided in a rack in which the electronic device is accommodated.

8. The electronic device system according to claim 6, wherein the cooling device includes:
a detector configured to detect the power consumption of the heat source or the temperature of the heat source.

9. The electronic device system according to claim 6, wherein a cross-sectional area at an output of the aspirator is smaller than a cross-sectional area at an input of the aspirator, and the steam pipe is coupled to the aspirator at an area adjacent to the output.

10. The electronic device system according to claim 6, wherein the cooling device includes:
a table having leak amounts associated with corresponding power consumption of the heat source,
wherein the power consumption of the heat source is detected and a leak valve included in the gas mixer is adjusted based on the leak amount obtained from the table and corresponding to the detected power consumption level.

11. The electronic device system according to claim 6, wherein the liquid supplier recovers the liquid in which the gas is mixed, separates the gas from the liquid, and supplies the liquid again to the aspirator and the evaporator.

* * * * *